United States Patent
Gokan et al.

(10) Patent No.: US 7,875,974 B2
(45) Date of Patent: Jan. 25, 2011

(54) LAMINATED MOUNTING STRUCTURE AND MEMORY CARD

(75) Inventors: Manabu Gokan, Hyogo (JP); Akihisa Nakahashi, Osaka (JP); Naoki Suzuki, Osaka (JP); Haneo Iwamoto, Osaka (JP); Satoru Yuhaku, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/337,267

(22) Filed: Dec. 17, 2008

(65) Prior Publication Data

US 2009/0166838 A1    Jul. 2, 2009

(30) Foreign Application Priority Data

Dec. 27, 2007    (JP) ............................. 2007-338121

(51) Int. Cl.
*H01L 23/34* (2006.01)
(52) U.S. Cl. .................. 257/723; 257/724; 257/730; 257/E23.063
(58) Field of Classification Search ......... 257/723–725, 257/730, E23.063–E23.065
See application file for complete search history.

(56) References Cited

U.S. PATENT DOCUMENTS

| 6,172,418 | B1 * | 1/2001 | Iwase ......................... 257/723 |
| 2007/0035002 | A1 * | 2/2007 | Moto et al. ................. 257/686 |
| 2008/0192423 | A1 * | 8/2008 | Nagai et al. ................ 361/683 |

FOREIGN PATENT DOCUMENTS

| JP | 09-199665 | 7/1997 |
| JP | 2001-217388 | 8/2001 |
| JP | 2002-207986 | 7/2002 |

* cited by examiner

*Primary Examiner*—Mary Wilczewski
*Assistant Examiner*—Paul E Patton
(74) *Attorney, Agent, or Firm*—McDermott Will & Emery LLP

(57) ABSTRACT

To provide a stacked mounting structure in which the number of semiconductor chips that can be stacked is greater than conventionally, as well as a method for fabricating the same, each semiconductor chip has electrodes provided at least at one end in the stacked mounting structure, and a board holding the semiconductor chips at the one end is folded with at least two of the semiconductor chips being stacked so as to at least partially overlap with each other.

8 Claims, 18 Drawing Sheets

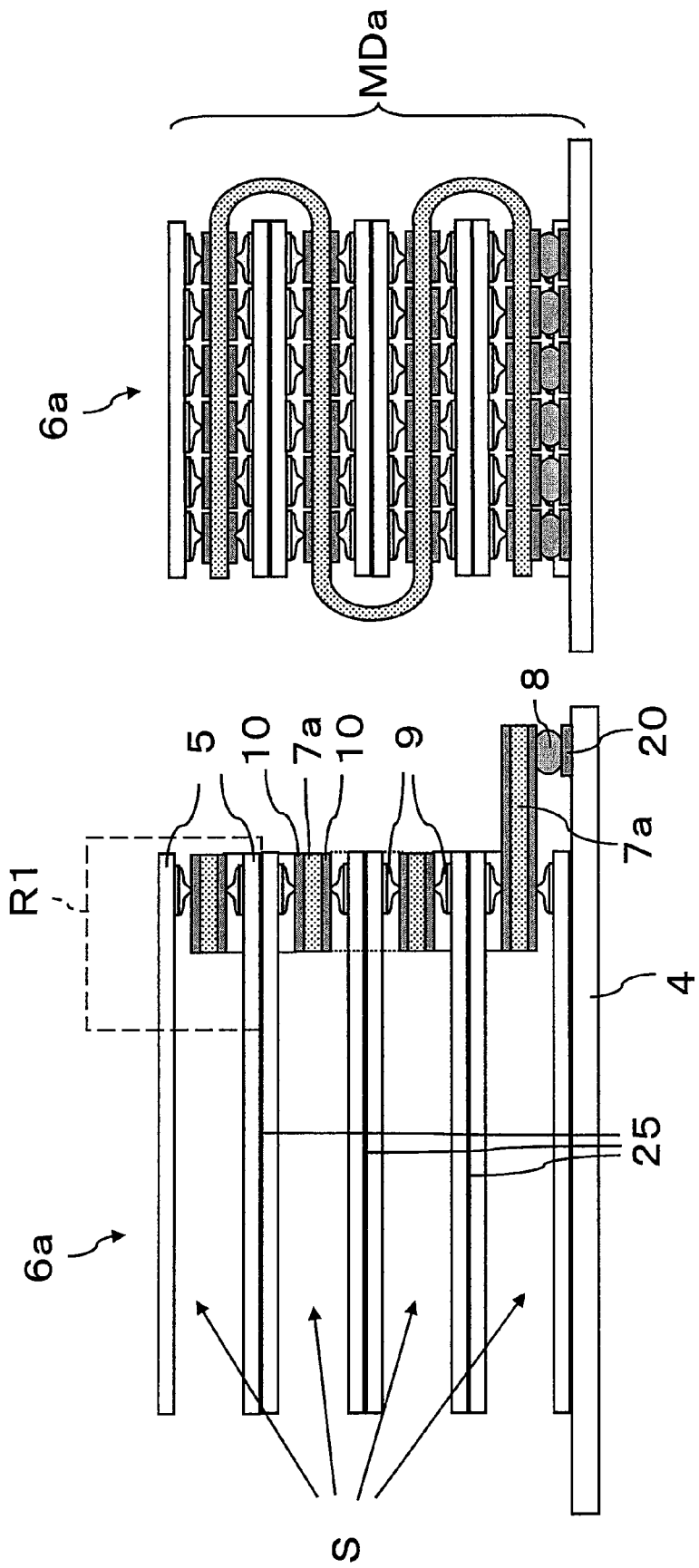

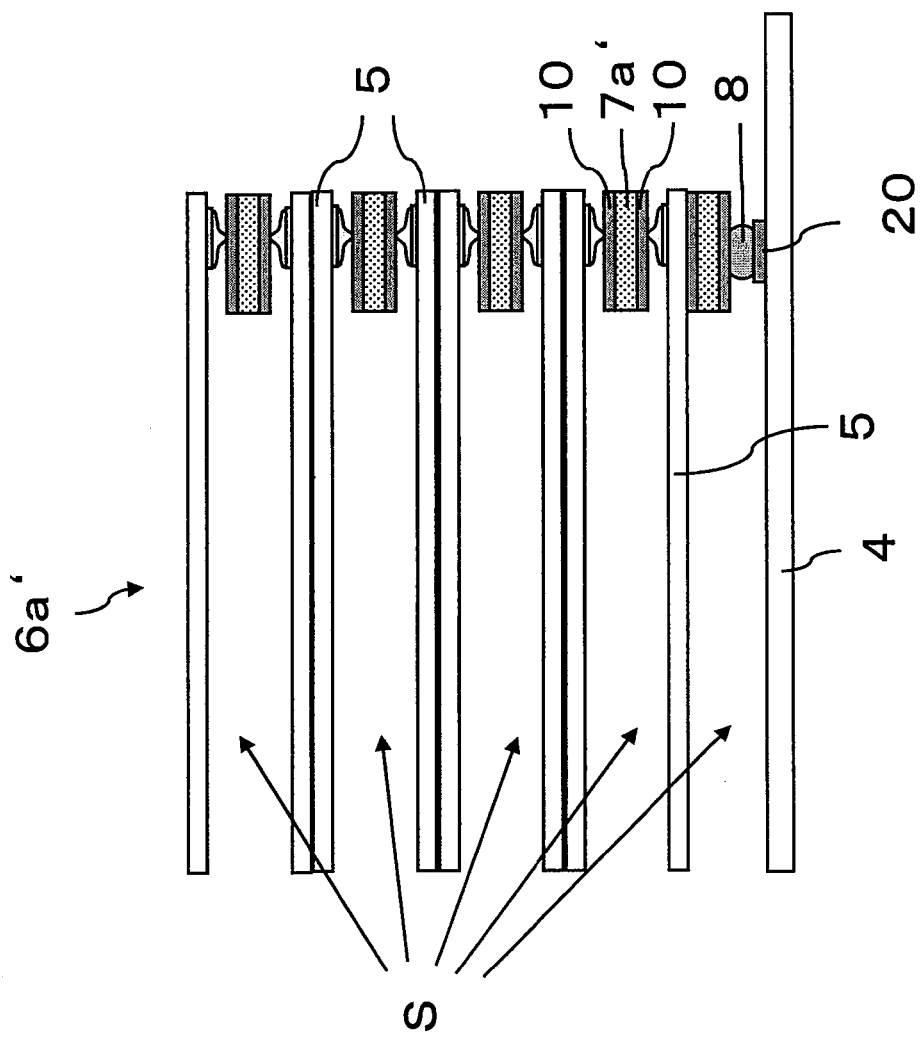

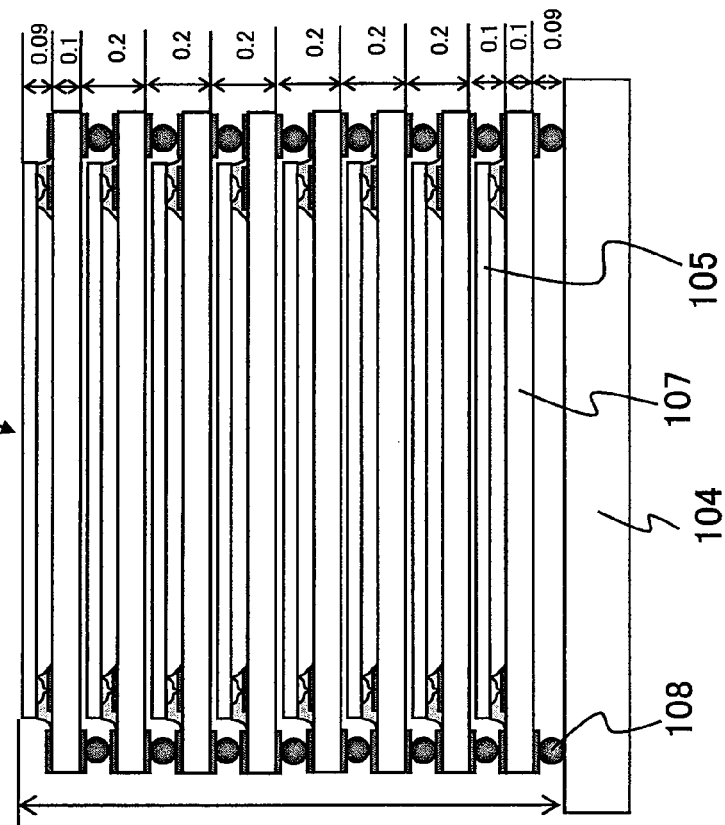
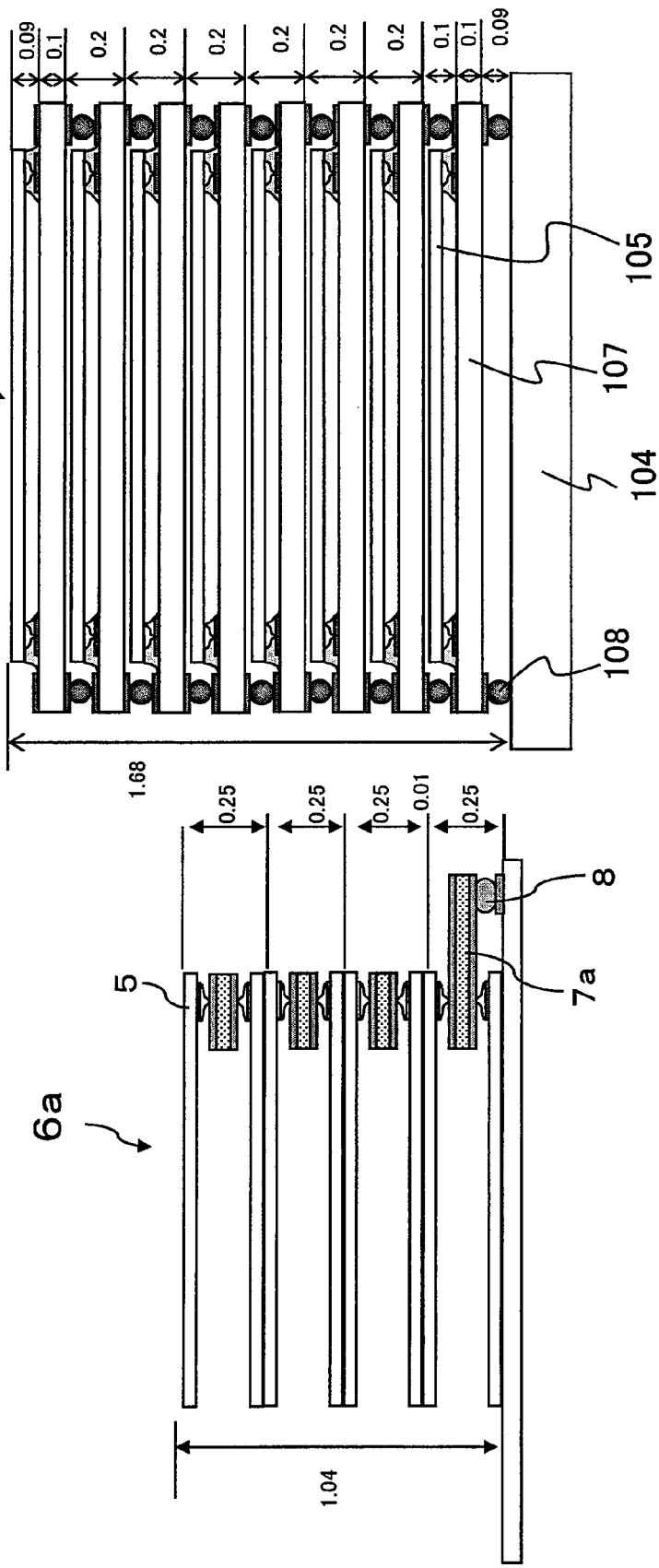

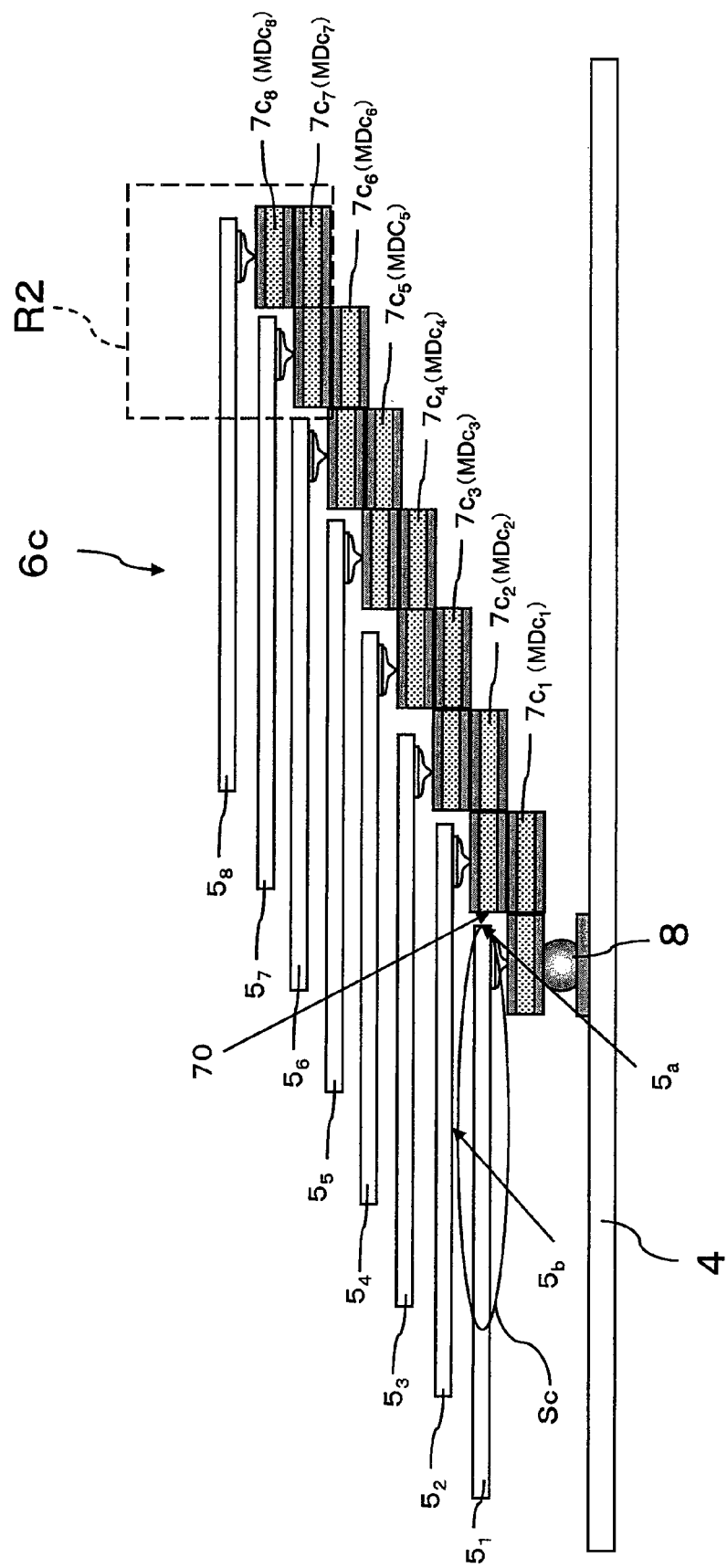
FIF. 11

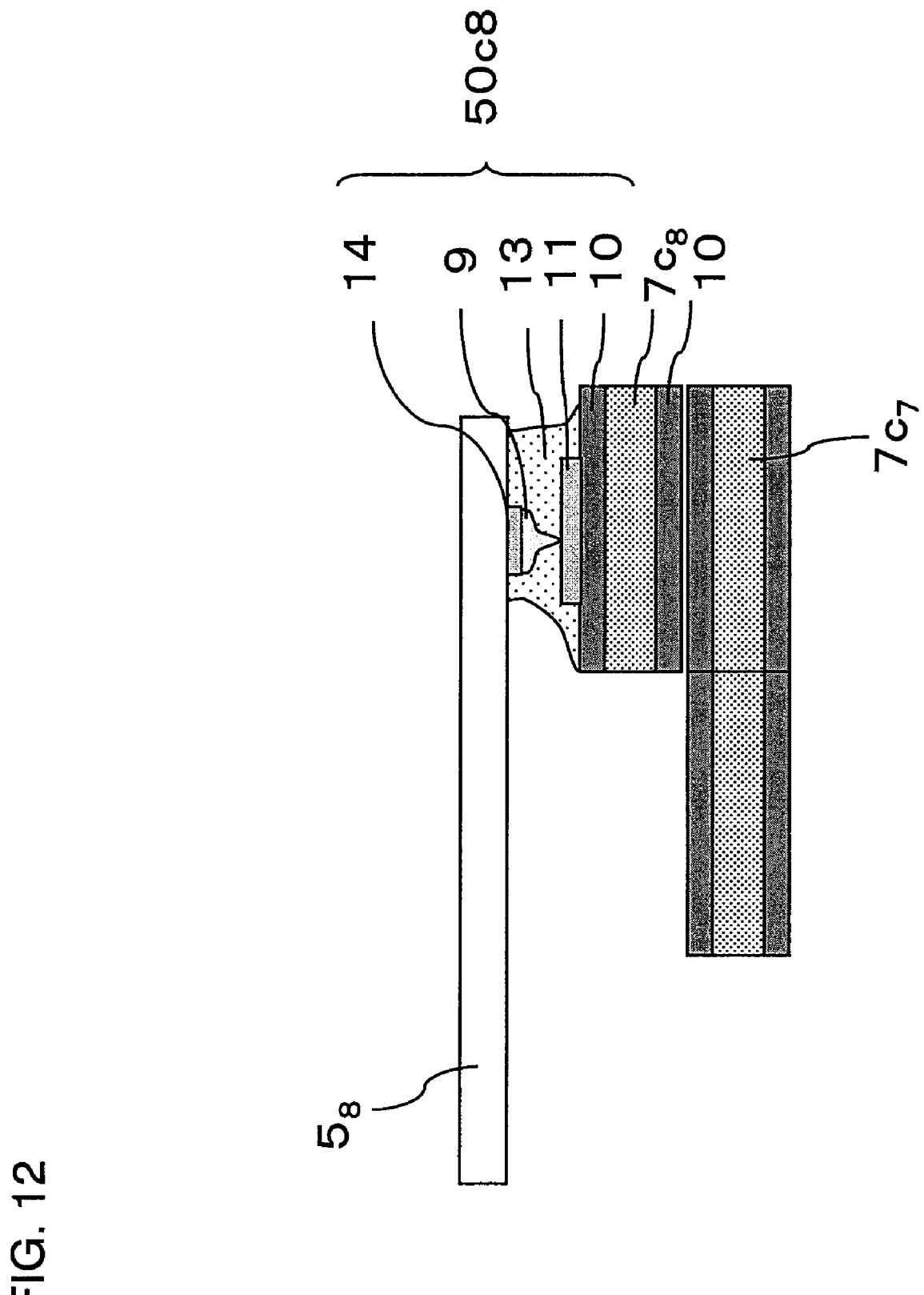

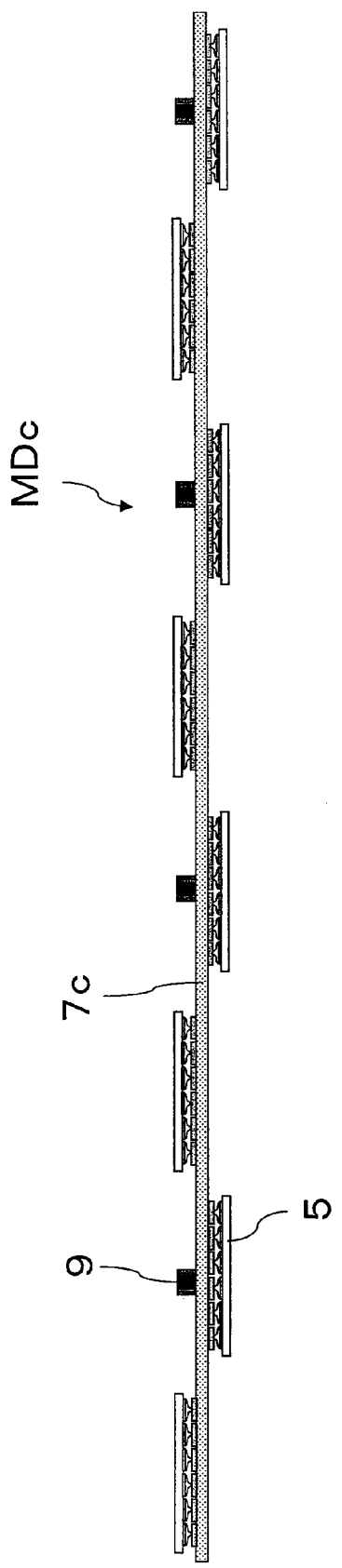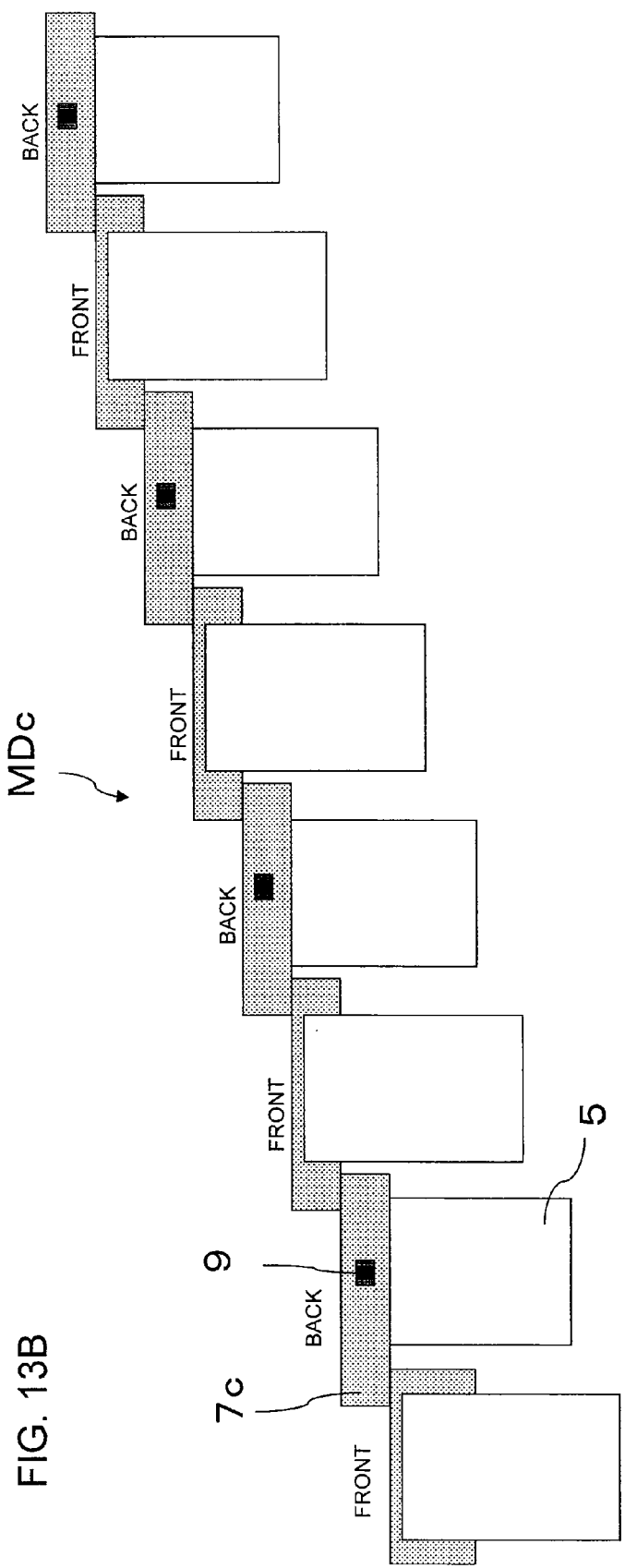
FIG. 13A
FIG. 13B

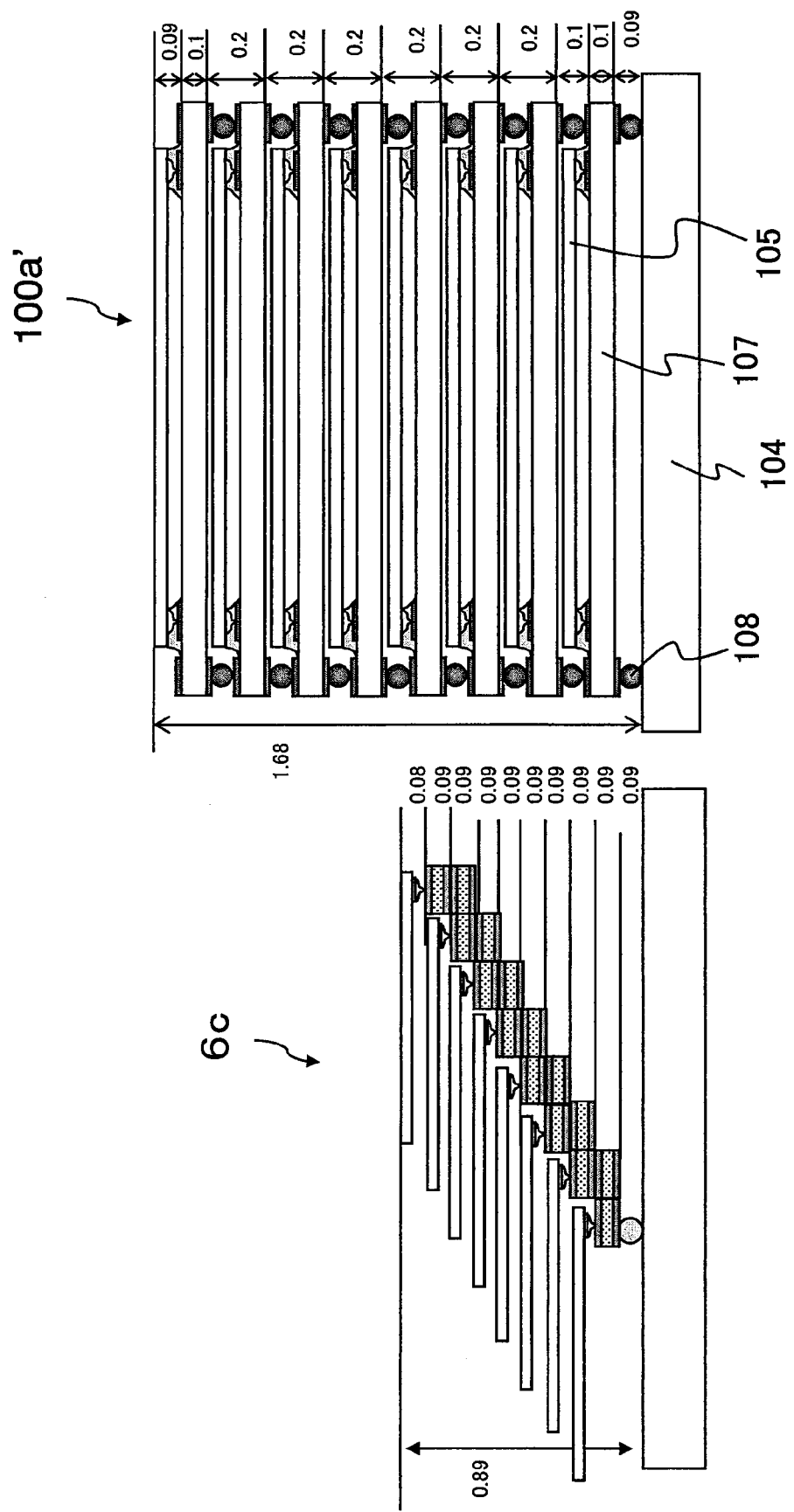

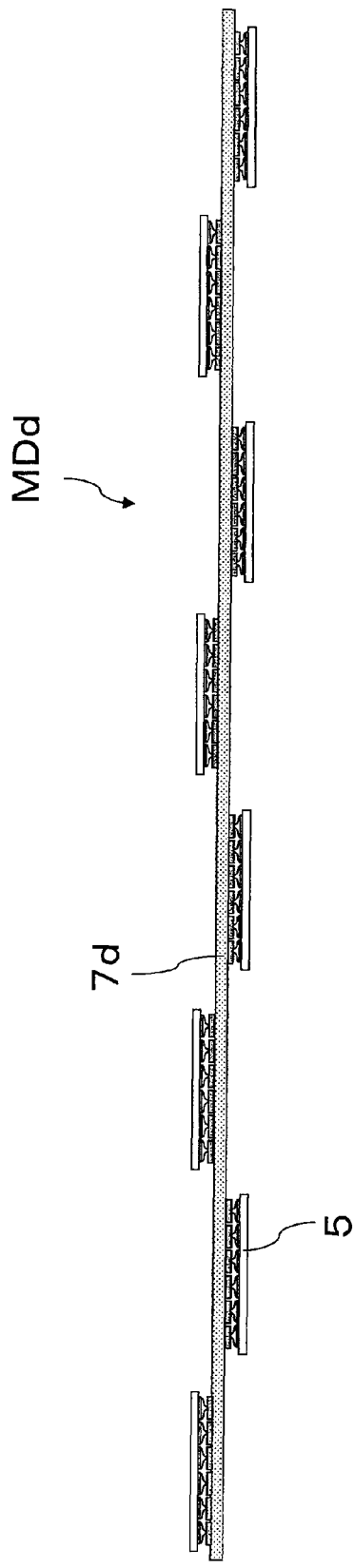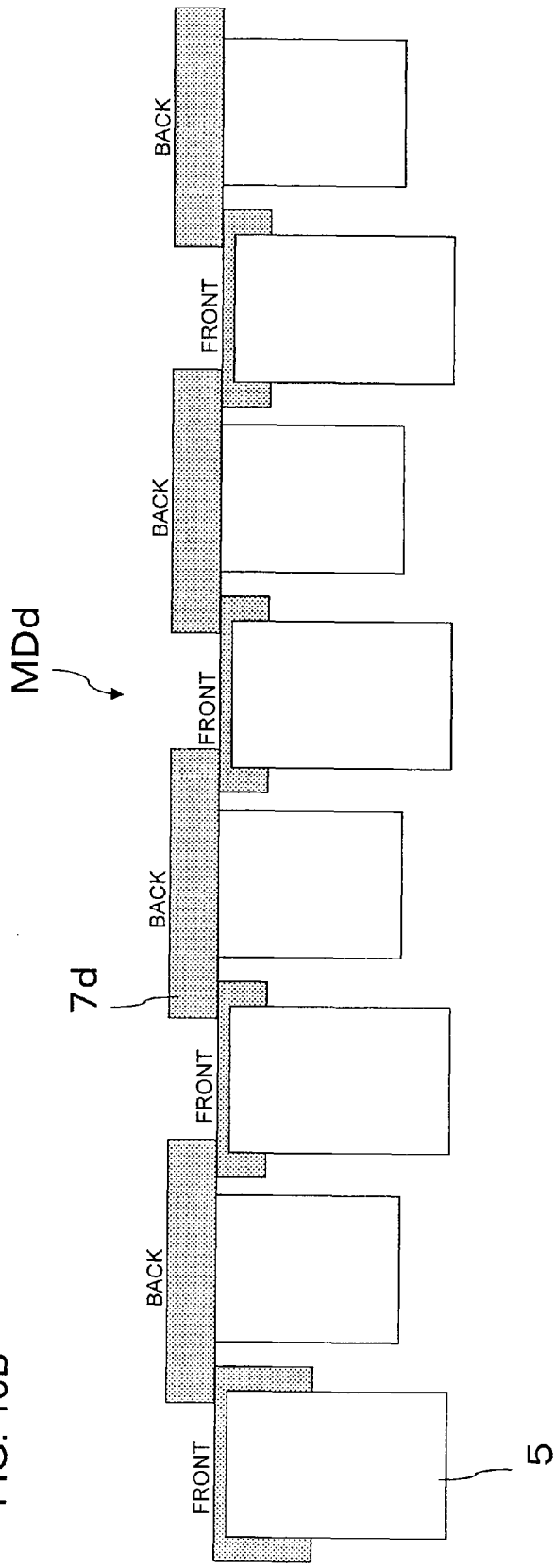

US 7,875,974 B2

LAMINATED MOUNTING STRUCTURE AND MEMORY CARD

FIELD OF THE INVENTION

The present invention relates to stacked mounting structures with semiconductor chips, and memory cards using the same.

BACKGROUND OF THE INVENTION

Recent years have seen increased use of small-sized memory cards, such as SD memory card, as recording media for cell phones, digital cameras, and so on. As device performance is enhanced, e.g., as the number of digital camera pixels increases, there has been increasing demand for memory cards with further increased capacity.

FIG. 17 illustrates exemplary stacked mounting structures with semiconductor chips conventionally used for satisfying the above demand. In the example shown in the figure, two stacked mounting structures 100a are arranged on one motherboard 104. Each stacked mounting structure 100a has semiconductor chips 105 mounted on one side of their respective boards 107. The board 107 and the semiconductor chip 105 mounted thereon are paired, and there are four pairs stacked on the motherboard 104 to form one stacked mounting structure 100a. The pairs of the board 107 and the semiconductor chip 105 are electrically connected by solder balls 108 provided between the boards 107 that are vertically adjacent to each other. In addition, the board 107 disposed at the bottom and the motherboard 104 are also electrically connected by solder balls 108 provided therebetween.

Also, there have been proposed stacked mounting structures having a semiconductor chip disposed on each side of boards as shown in FIG. 18 (see, for example, Japanese Laid-Open Patent Publication No. 2002-207986). In the example shown in the figure, two stacked mounting structures 100b are arranged on one motherboard 104. Each stacked mounting structure 100b has a semiconductor chip 105 mounted on each side of boards 107. The board 107 and the two semiconductor chips 105 mounted thereon are paired, and there are two pairs stacked on the motherboard 104 to form one stacked mounting structure 100b. An insulating sheet 125 is disposed where two semiconductor chips 105 face each other.

Also, there have been proposed stacked mounting structures each configured by folding a flexible board with semiconductor chips mounted thereon (see, for example, FIG. 1 of Japanese Laid-Open Patent Publication No. 2001-217388, and FIG. 1 of Japanese Laid-Open Patent Publication No. 9-199665).

The above-described conventional stacked mounting structures have size problems that are to be solved to satisfy the demand for further increased capacity. Concretely, the size of memory cards as typified by the SD memory card is defined by standards. Accordingly, a memory card (stacked mounting structure) with increased capacity cannot be achieved unless either the capacity per mounted semiconductor chip or the number of stacked semiconductor chips is increased.

Here, in order to increase the capacity per semiconductor chip, it is necessary to increase the recording density of the semiconductor chip. In this case, a new semiconductor design/fabrication process has to be developed, imposing high cost burden. In addition, it takes some time between the development phase and actual distribution to the market for use in memory cards. That is, there are significant problems with fabrication cost and lead time. As such, an attempt to increase the capacity per semiconductor chip in order to increase the capacity of the memory card leads to a significant cost increase.

Accordingly, from the perspective of cost, a desirable method would be to increase the capacity by increasing the number of stacked semiconductor chips. However, in the case of the above-described conventional stacked mounting structures, due to restricted size of the memory card, the number of stacked semiconductor chips cannot be increased unless each pair of the semiconductor chip and the board is reduced in thickness. In this case, it is necessary to further reduce the thickness of the board while maintaining structural strength and insulation properties. Therefore, a new design/fabrication process has to be developed, causing problems similar to those in the case of increasing the recording density of the semiconductor chip.

Also, in the case of the above-described conventional stacked mounting structures, a number of boards having the semiconductor chip(s) mounted thereon have to be stacked with conductive materials provided therebetween for connection, and therefore it is difficult to ensure satisfactory connecting quality for lamination. Accordingly, for that reason as well, the number of stacked semiconductor chips is limited.

As well, in the case of the above-described conventional stacked structure using a flexible board, the flexible board is required to cover the entire surfaces of the semiconductor chips for insulation, resulting in increased cost and limited number of laminations due to the thickness of the board.

The present invention has been made in view of the aforementioned problems, and an object thereof is to provide a stacked mounting structure in which the number of semiconductor chips that can be stacked within the same volume is greater than conventionally.

BRIEF SUMMARY OF THE INVENTION

To attain the above object, the present invention provides a stacked mounting structure including:

a plurality of semiconductor chips each having electrodes provided at least at one end; and a holding member for holding the semiconductor chips at the one end, wherein the holding member is folded with at least two of the semiconductor chips being stacked so as to at least partially overlap with each other.

Here, the holding member is preferably composed of a tape-like sheet. In addition, it is preferable that the semiconductor chips at least partially protrude from the holding member. It is also preferable that the semiconductor chips be stacked so as to be flush at the one end with one another in a lamination direction. It is also preferable that the semiconductor chips be stacked such that adjacent semiconductor chips deviate at the one end from each other in a direction perpendicular to the lamination direction. Here, the location of the one end may deviate uniformly in one direction perpendicular to the lamination direction, or may alternately deviate back and forth in one direction perpendicular to the lamination direction.

The holding member preferably has an electronic part mounted thereon. In addition, it is preferable that the holding member and the semiconductor chips be joined via bumps. It is also preferable that the stacked mounting structure further includes an insulating sheet interposed between each respective semiconductor chip.

Furthermore, first and second units each composed of the aforementioned stacked mounting structure are provided, and the first and second units may be assembled with their respective semiconductor chips overlapping with one another.

The present invention can achieve a stacked mounting structure in which the number of semiconductor chips that can be stacked is greater than conventionally.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE SEVERAL VIEWS OF THE DRAWING

FIGS. 3A and 3B are schematic views each illustrating an end surface of the stacked mounting structure of FIG. 2.

FIGS. 4A and 4B are schematic views each illustrating an end surface of a variant of the stacked mounting structure of FIG. 2.

FIGS. 9A and 9B are explanatory diagrams respectively illustrating the stacked mounting structure of FIG. 2 and a conventional stacked mounting structure for comparison in height therebetween.

FIG. 11 is a schematic view illustrating an end surface of the stacked mounting structure of FIG. 10.

FIG. 12 is an enlarged view of a portion enclosed by rectangle R2 of FIG. 11.

FIGS. 13A and 13B are views each illustrating in unfolded configuration a stacked mounting semiconductor module of FIG. 11.

FIGS. 14A and 14B are explanatory diagrams respectively illustrating the stacked mounting structure of FIG. 11 and a conventional stacked mounting structure for comparison in height therebetween.

FIGS. 15A and 15B are views each illustrating in unfolded configuration a stacked mounting semiconductor module in the stacked mounting structure according to the third embodiment of the present invention.

DETAILED DESCRIPTION OF THE INVENTION

Figure 1B:
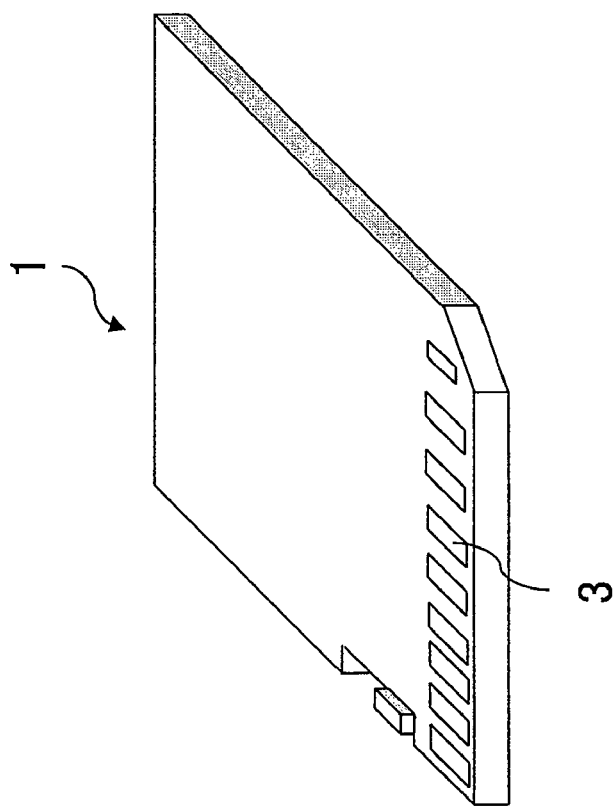
FIGS. 1A and 1B are oblique external views of an SD memory card having incorporated therein stacked mounting structures according to the present invention.
Figure 1A:
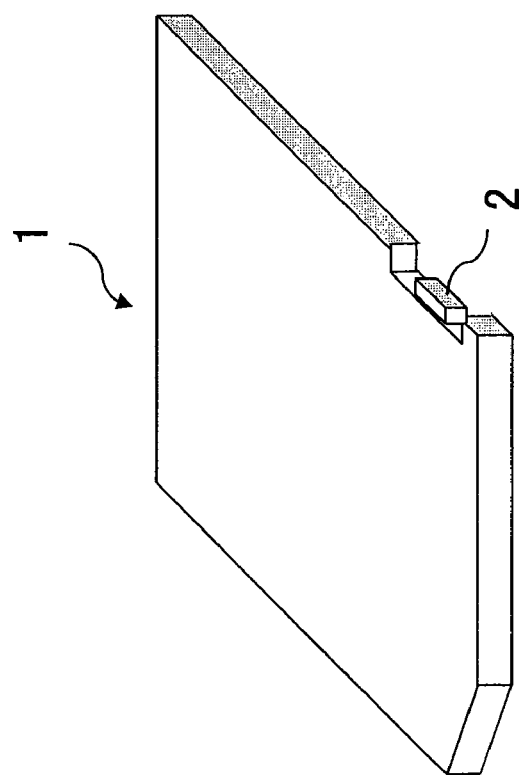

Hereinafter, stacked mounting structures according to embodiments of the present invention and a method for fabricating the same will be described taking an SD memory card (secure digital memory card) as an example. FIGS. 1A and 1B illustrate the appearance of the front and back surfaces, respectively, of an SD memory card 1. The SD memory card 1 is in the form of a plate with standardized dimensions: 24 mm in width, 32 mm in height, and 2.1 mm in thickness.

As can be appreciated from FIG. 1A, the SD memory card 1 has one side edge provided with a changeover switch 2 alternating between activation and deactivation of a data protection mechanism. Also, as can be appreciated from FIG. 1B, the SD memory card 1 has a plurality of electrodes 3 arranged at one marginal side of the back surface. The SD memory card 1 has provided therein a motherboard on which a plurality of semiconductor chips are stacked as memory chips.

First Embodiment

Figure 2:
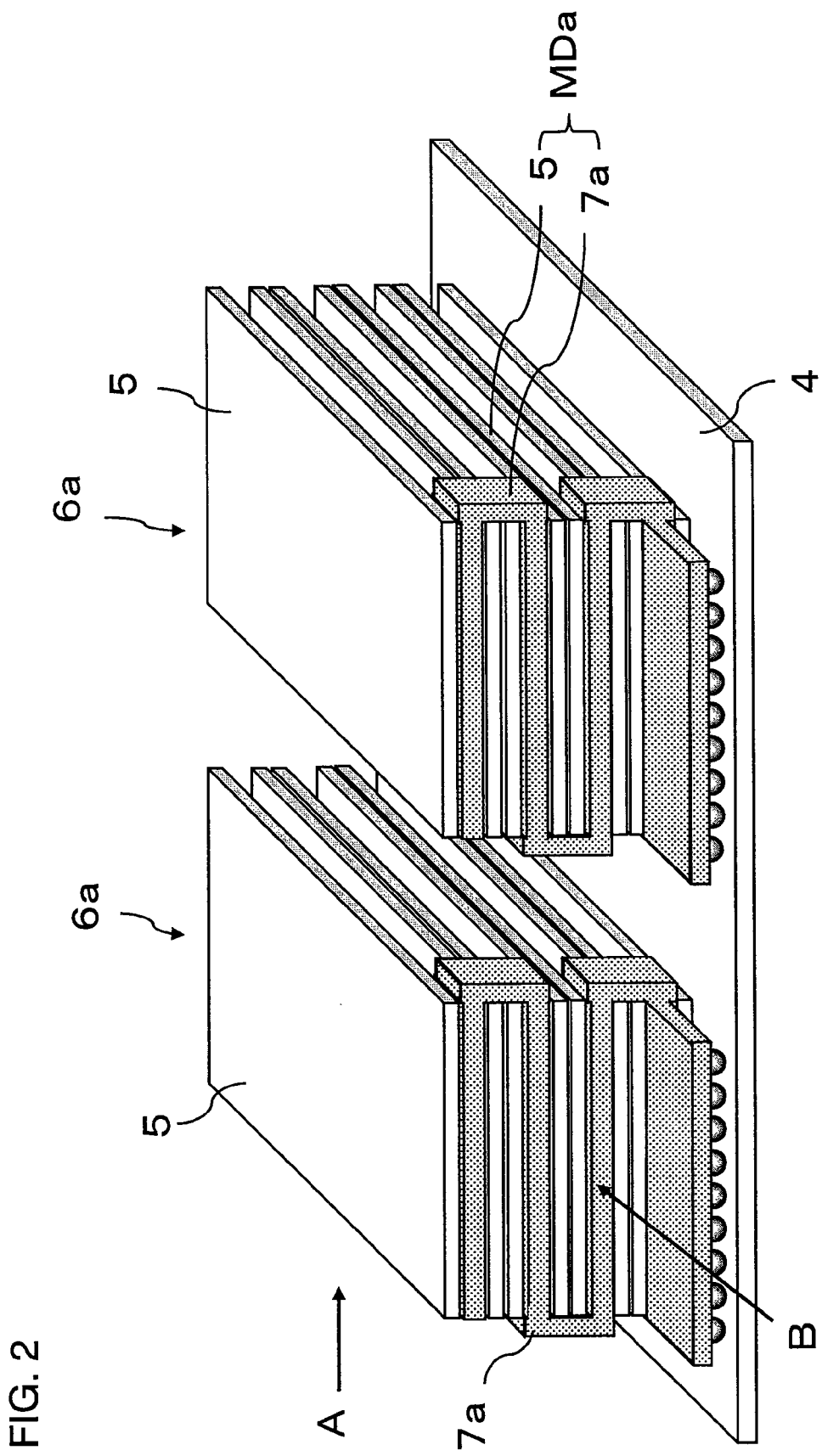
FIG. 2 is an oblique external view illustrating stacked mounting structures according to a first embodiment of the present invention.

A stacked mounting structure according to a first embodiment of the present invention will be described with reference to FIGS. 2, 3A, 3B, 4A, 4B, 5A, 5B, 6, and 7. FIG. 2 is an oblique external view schematically illustrating stacked mounting structures 6a with semiconductor chips stacked on a motherboard within the SD memory card 1. There are two stacked mounting structures 6a arranged on one motherboard 4. Note that instead of disposing the same two stacked mounting structures 6a, one stacked mounting structure 6a and another stacked mounting structure 6 (not shown) that is mirror-reversed about the center line of the stacked mounting structure 6a may be disposed on the motherboard 4.

Each stacked mounting structure 6a is composed of eight semiconductor chips 5 mounted on one board 7a. A flexible board made of a base material, such as polyimide or aramid, is used as the board 7a.

Figure 5A:
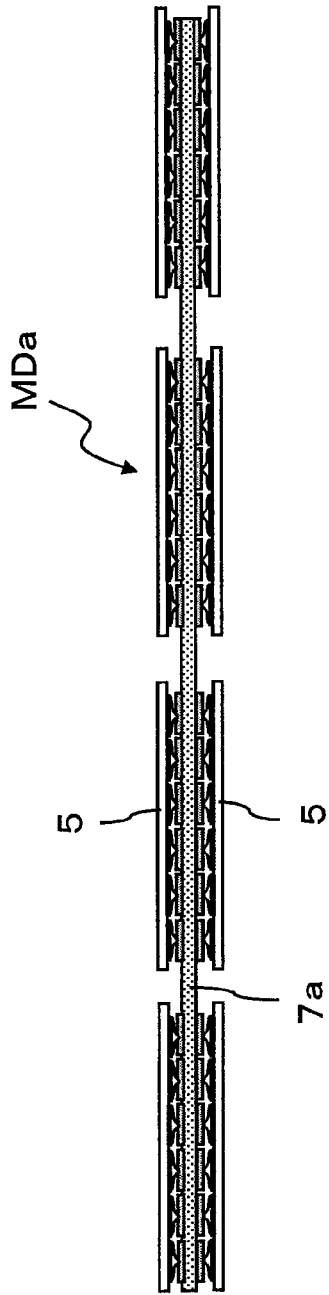
FIGS. 5A and 5B are views each illustrating the stacked mounting semiconductor module of FIG. 2 in unfolded configuration.
Figure 5B:
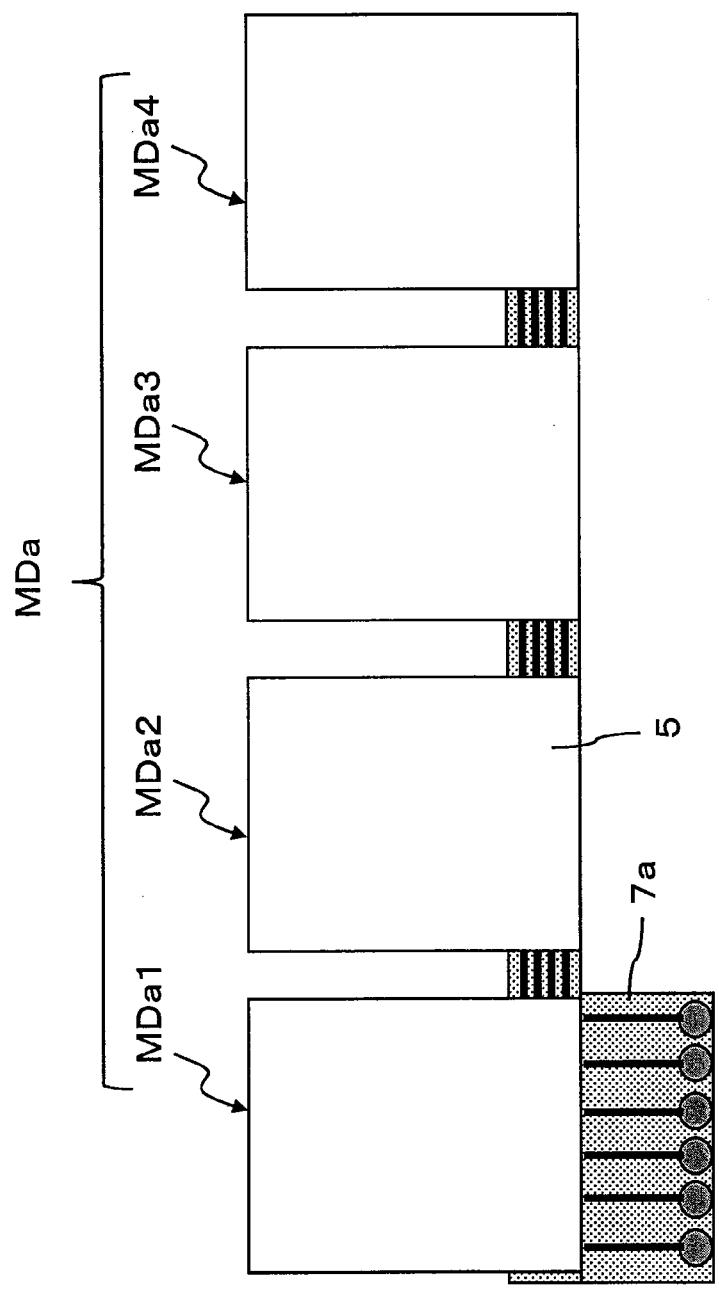

FIGS. 5A and 5B each illustrate a stacked mounting semiconductor module MDa included in the stacked mounting structure 6a. In the example shown, the stacked mounting semiconductor module MDa is configured by a plurality of submodules each being formed by two semiconductor chips 5 mounted on the board 7a. The stacked mounting semiconductor module MDa will be described in detail later. For convenience of explanation, the side on which the stacked mounting structure 6a (or a stacked mounting structure 6a' to be described later) is placed is referred to as the "top side" or "top direction" of the motherboard 4, and the other side is referred to as the "bottom side" or "bottom direction" of the motherboard 4. Disposed on the bottom side of the motherboard 4 are the electrodes 3 exposed on the back surface of the SD memory card 1 in FIG. 1B, and a controller IC for controlling the semiconductor chips 5.

FIG. 3A illustrates an end surface of the stacked mounting structure 6a as viewed in the direction of arrow A in FIG. 2. For the sake of visibility, a portion of the board 7a that is connected to the semiconductor chips 5 on the front side in the figure is indicated by dotted lines. FIG. 3B illustrates an end surface of the stacked mounting structure 6a as viewed in the direction of arrow B in FIG. 2. Electrodes 10 are provided on both surfaces of the board 7a between two semiconductor chips 5, in association with their respective bumps 9 on the semiconductor chips 5. The electrodes 10 are joined to the bumps 9 to connect eight semiconductor chips 5 together with one board 7a.

Note that although not shown for the sake of overall visibility, an insulating sheet 25 is provided between each respective semiconductor chip 5. In addition, connecting portions 50a each including the bumps 9 and the terminals 10 (see FIG. 7) are formed between the board 7a and the semiconductor chips 5, but FIGS. 3A and 3B only show the bumps 9 and the terminals 10 that constitute part of the connecting portions 50a due to limitations of space. The connecting portion 50a will be described in detail later.

As described above, in the present embodiment, eight semiconductor chips 5 are mounted on one board 7a to form one stacked mounting semiconductor module MDa. The stacked mounting structure 6a is configured with the stacked mounting semiconductor module MDa being folded as shown in FIG. 3B. As a result, as shown in FIG. 3A, space S corresponding to the thickness of the connecting portion 50a is formed between two semiconductor chips 5 connected via the board 7a. Furthermore, in FIGS. 3A and 3B, the bottom layer, i.e., a portion of the board 7a that immediately overlies the motherboard 4, has the electrodes 10 provided on the bottom surface, which is joined to electrodes 20 provided on the top side of the motherboard 4 via the solder balls 8.

Next, a variant of the stacked mounting structure 6a will be described with reference to FIGS. 4A and 4B. FIG. 4A illustrates an end surface of a stacked mounting structure 6a', which is the variant of the stacked mounting structure 6a, as viewed in the direction of arrow A in FIG. 2 as in FIG. 3A. Also, FIG. 4B illustrates an end surface of the stacked mounting structure 6a', as viewed in the direction of arrow B in FIG. 2 as in FIG. 3B. Unlike the stacked mounting structure 6a having the bottom-layer semiconductor chip 5 mounted directly on the top surface of the motherboard 4, the stacked mounting structure 6a' has the bottom-layer semiconductor chip 5 mounted above the motherboard 4 with electrodes 10, a board 7a', electrodes 10, solder balls 8, and electrodes 20 interposed therebetween.

FIG. 5A illustrates the stacked mounting semiconductor module MDa in unfolded configuration, which is shown in FIG. 3B as being folded. FIG. 5B illustrates a top view of the stacked mounting semiconductor module MDa. Note that in the example shown in FIGS. 5A and 5B, one board 7a has four semiconductor chips 5 mounted on each surface, i.e., eight on both surfaces, but the semiconductor chips 5 may be only mounted on one surface of the board 7a, and the number to be mounted may not necessarily be four. Furthermore, the semiconductor chips 5 may not necessarily be mounted at the same corresponding positions on both surfaces of the board 7a.

Note that in the case of the stacked mounting semiconductor module MDa having the semiconductor chips 5 mounted on both surfaces of the board 7a, two semiconductor chips 5 provided at the same corresponding positions and the board 7a constitute one submodule MDa(n) (where n is a natural number less than or equal to the number of semiconductor chips 5 mounted on one surface of the board 7a; in the present example, n=1, 2, 3, or 4). On the other hand, in the case of the stacked mounting semiconductor module MDa having the semiconductor chips 5 mounted on only one surface of the board 7a, one semiconductor chip 5 and the board 7a constitute one submodule MDa(n). However, even in the case of the stacked mounting semiconductor module MDa having the semiconductor chips 5 mounted on both surfaces of the board 7a, if the semiconductor chips 5 are not provided at the same corresponding positions on both surface of the board 7a, one semiconductor chip 5 and the board 7a constitute one submodule MDa(n).

Figure 6:
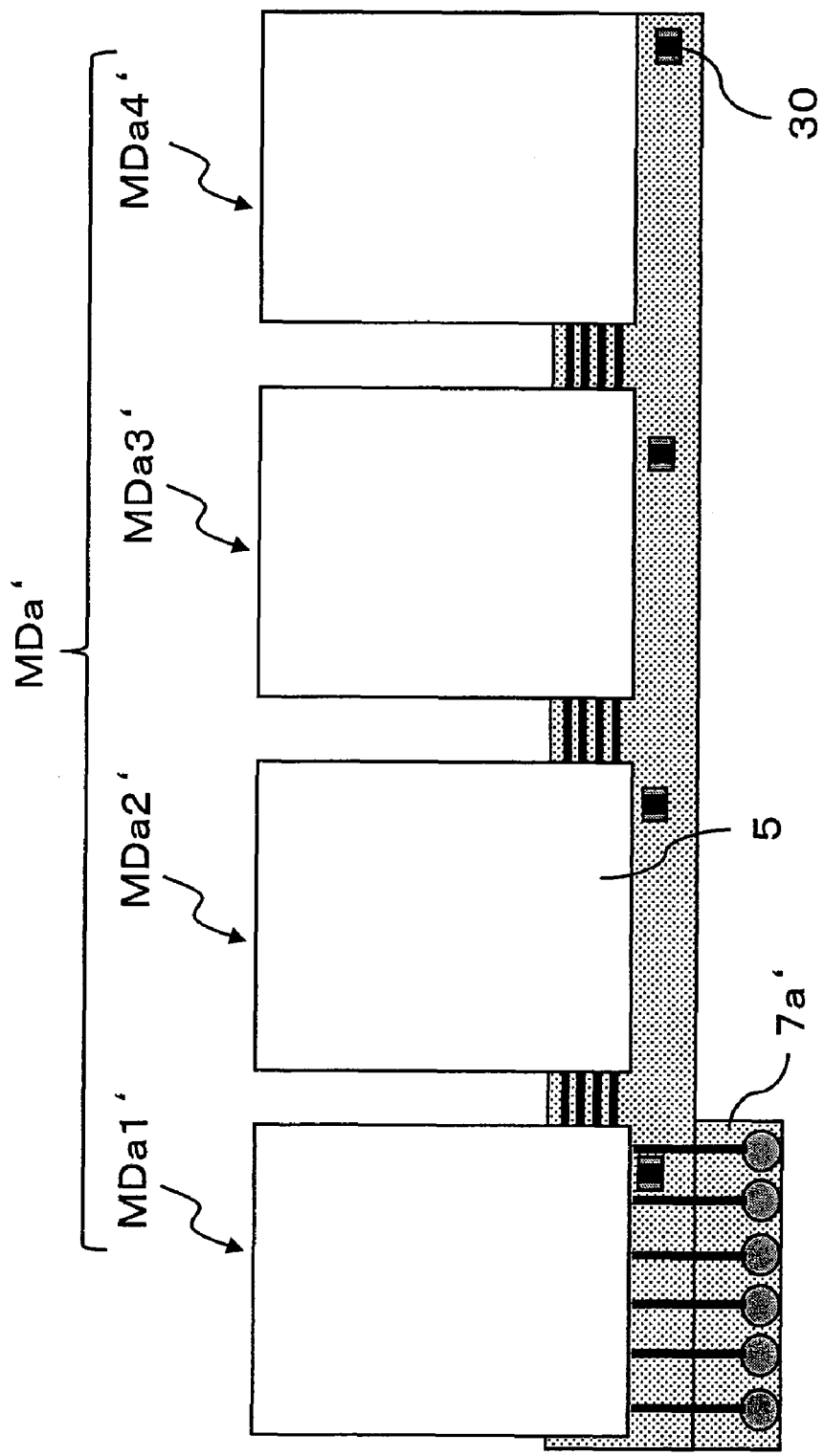
FIG. 6 is a view illustrating in unfolded configuration the stacked mounting semiconductor module as shown in FIGS. 4A and 4B.

FIG. 6 illustrates a top view of the board 7a', which is a variant of the board 7a. While the board 7a of FIGS. 5A and 5B is formed so as to protrude only from the bottom-layer semiconductor chip 5, the board 7a' of FIG. 6 is formed so as to protrude from the semiconductor chips 5 across its length. On such a protruding portion of the board 7a', electronic parts 30, such as chip capacitors, chip resistors, and/or chip inductors, can be mounted in an unoccupied space. Note that in this variant also, a stacked mounting semiconductor module MDa' is configured by submodules MDa1', MDa2', MDa3', and MDa4' each being formed by the board 7a' and two semiconductor chips 5.

Figure 7:
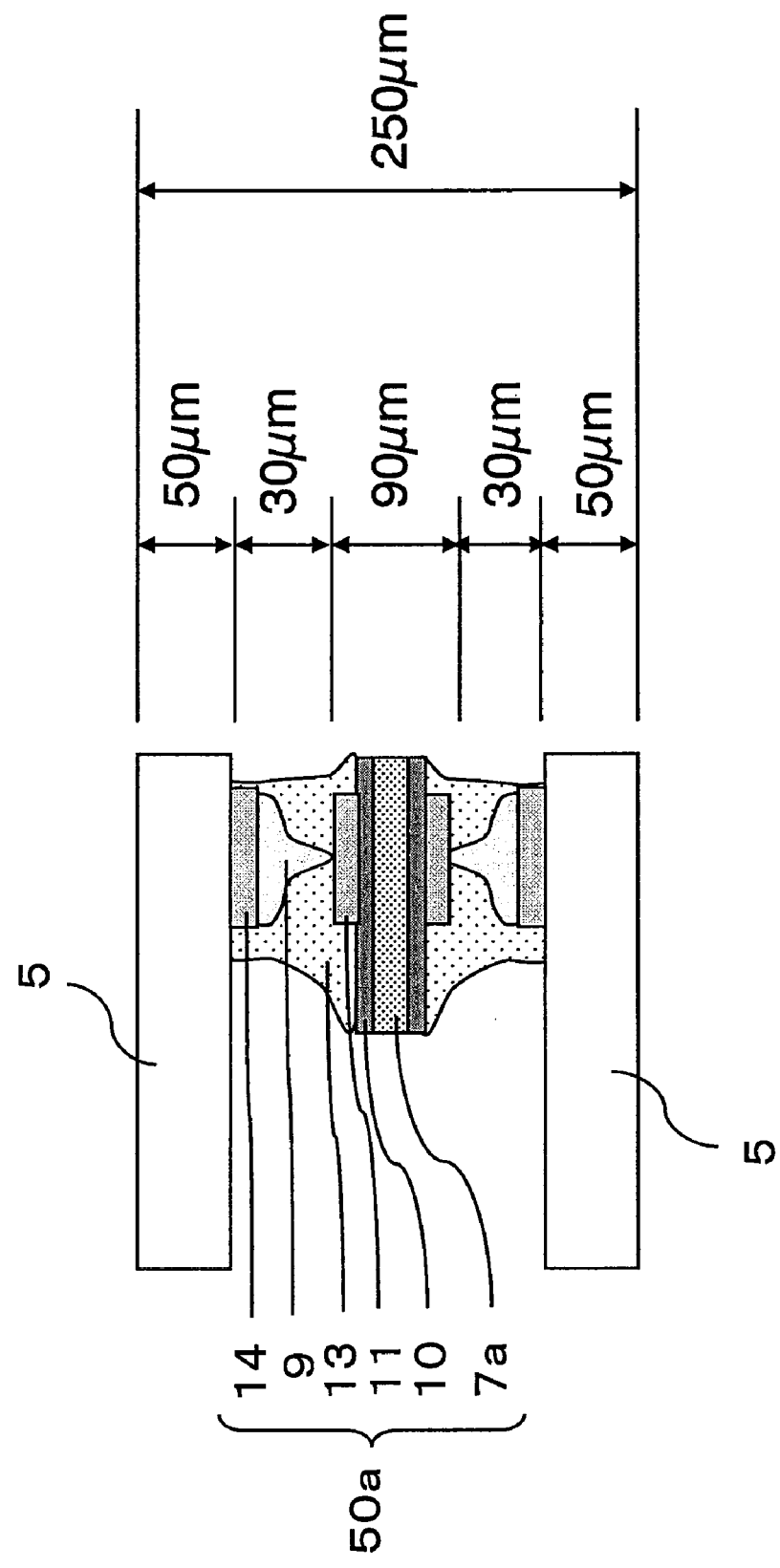
FIG. 7 is an enlarged view of a portion enclosed by rectangle R1 of FIG. 3A.

FIG. 7 illustrates in enlargement a portion of the stacked mounting semiconductor module MDa that is enclosed by broken lines R1 in FIG. 3A. The semiconductor chips 5 are mounted on the board 7a by flip-chip bonding. The board 7a is provided with connecting portions 50a for connecting the semiconductor chips 5. Concretely, the board 7a has electrodes 10 provided on surfaces facing the semiconductor chips 5, each electrode 10 having a land 11 for bump provided thereon. Each semiconductor chip 5 has bumps 14 for electrode provided on the surface facing the board 7a, each electrode bump 14 having a bump 9 provided thereon. A reinforcing resin 13 is provided around the bumps 9, the bump lands 11, and the electrode bumps 14, with the bumps 9 connected to the bump lands 11.

The reinforcing resin 13 is made of a resin material, such as NCF (non-conductive film). The bumps 9 are made of gold. Thus, the board 7a and the semiconductor chips 5 are electrically connected by the bumps 9, the bump lands 11, the electrode bumps 14, and the electrodes 10. FIG. 7 shows by way of example the length of each element included in the connecting portion 50a in the direction perpendicular to the mounting surface of the board 7a.

Second Embodiment

Figure 8:
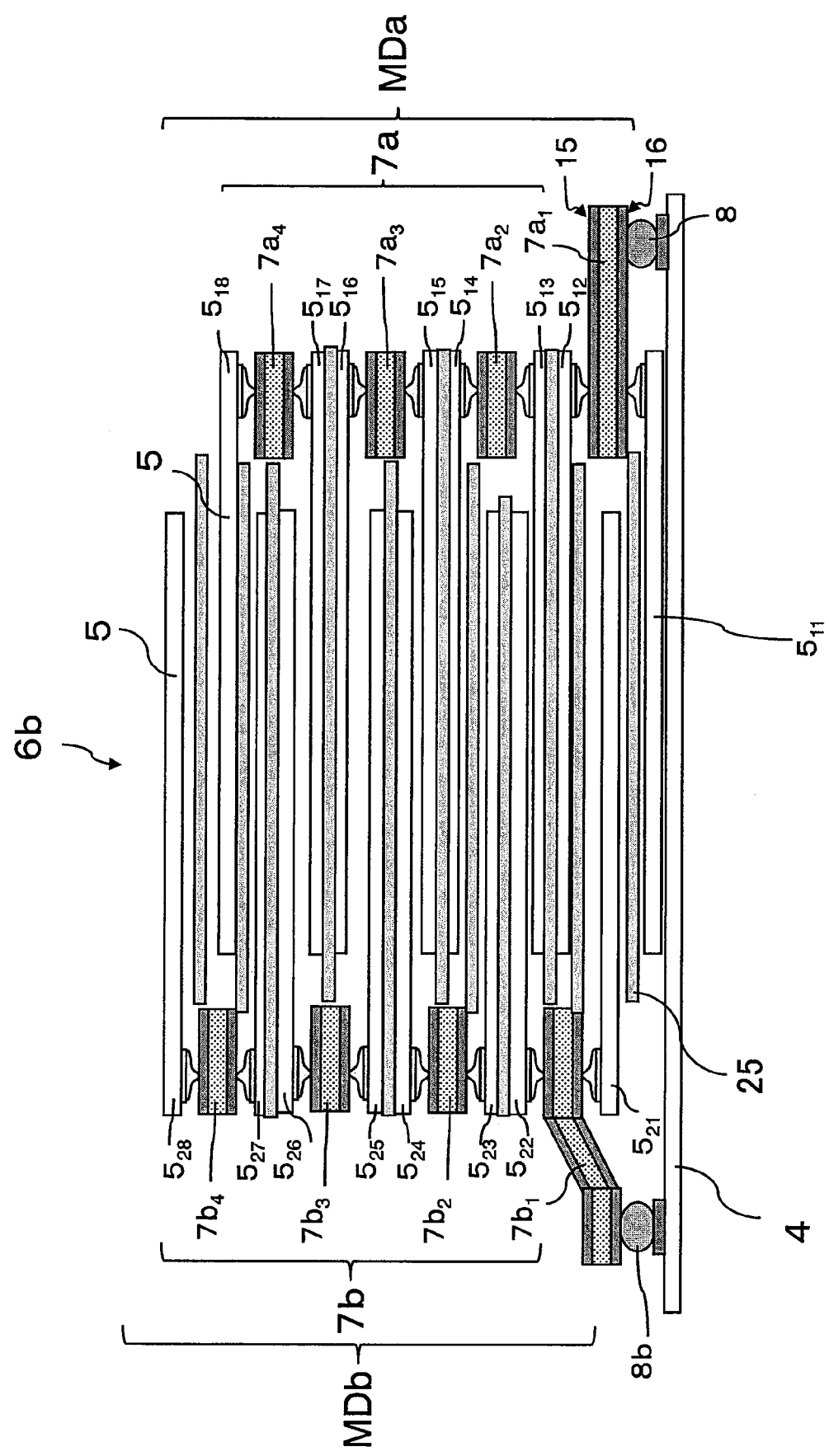
FIG. 8 is a schematic view illustrating an end surface of a stacked mounting structure according to a second embodiment of the present invention.

Next, a stacked mounting structure according to a second embodiment of the present invention will be described with reference to FIGS. 8, 9A, and 9B. FIG. 8 illustrates an end surface of a stacked mounting structure 6b, as viewed in the direction of arrow A as in FIG. 3A. Note that for the sake of overall visibility, a portion of the board 7a as indicated by dotted lines in FIG. 3A is omitted in FIG. 8. The stacked mounting structure 6b according to the present embodiment, in simple terms, is configured to allow mounting of twice the capacity of the semiconductor chip 5 that can be mounted in approximately the same volume as in the above-described stacked mounting structure 6a. While the stacked mounting structure 6a is configured by one stacked mounting semiconductor module MDa, the stacked mounting structure 6b is configured by two stacked mounting semiconductor modules MDa and MDb.

Concretely, the stacked mounting structure 6b configured by the two stacked mounting semiconductor modules MDa and MDb is achieved by partially fitting the stacked mounting semiconductor module MDb into spaces S each being formed between two semiconductor chips 5 of the stacked mounting semiconductor module MDa in the first embodiment. The stacked mounting semiconductor module MDb is configured to be the same as the stacked mounting semiconductor module MDa, except that the lowest portion of the board 7b is positioned higher by a combined thickness of the bottom-layer semiconductor chip 5 and the insulating sheet 25 of the stacked mounting semiconductor module MDa, and a portion protruding from the semiconductor chips 5 is bent correspondingly. In addition, the solder balls 8$b$ for connecting the lowest portion of the board 7$b$ to the motherboard 4 are sized to have a larger diameter than the solder balls 8 for connecting the stacked mounting semiconductor module MDa to the motherboard 4.

For convenience of explanation, the semiconductor chips 5 disposed at the bottom of the stacked mounting semiconductor modules MDa and MDb are denoted by characters $5_{11}$ and $5_{21}$, respectively; the second-from-bottom semiconductor chips 5 are denoted by characters $5_{12}$ and $5_{22}$, respectively; and similarly, the third through eighth-from-bottom semiconductor chips 5 are denoted by characters $5_{13}$ through $5_{18}$ and characters $5_{23}$ through $5_{28}$, respectively. In addition, as for the boards 7$a$ and 7$b$, when they are folded, their bottom portions are denoted by characters $7a_1$ and $7b_1$, respectively; the second-from-bottom portions are denoted by characters $7a_2$ and $7b_2$, respectively; and similarly, the third and fourth-from-bottom portions are denoted by characters $7a_3$ and $7b_3$ and characters $7a_4$ and $7b_4$, respectively.

In this manner, the stacked mounting semiconductor module MDa is configured by the boards $7a_1$, $7a_2$, $7a_3$, and $7a_4$ having their respective pairs of semiconductor chips $5_{11}$ and $5_{12}$, $5_{13}$ and $5_{14}$, $5_{15}$ and $5_{16}$, and $5_{17}$ and $5_{18}$ mounted thereon. Similarly, the stacked mounting semiconductor module MDb is configured by the boards $7b_1$, $7b_2$, $7b_3$, and $7b_4$ having their respective pairs of semiconductor chips $5_{21}$ and $5_{22}$, $5_{23}$ and $5_{24}$, $5_{25}$ and $5_{26}$, and $5_{27}$ and $5_{28}$ mounted thereon. In addition, as shown in FIG. 8, the surface portion of the board $7a_1$ that faces the motherboard 4 and the remaining surface portion continuing therefrom are collectively referred to by the term "bottom surface 16", and the surface opposite to the bottom surface 16 is referred to as the "top surface 15" for mutual distinction.

Also, the insulating sheet 25 is provided between each respective semiconductor chip 5 in order to prevent the semiconductor chip 5 from contacting another semiconductor chip. The insulating sheet 25 provided between the semiconductor chips 511 and 521 protrudes at one end in a width direction (horizontal direction in the figure) from the tip of the semiconductor chip 511 outwardly (toward the left side of the figure), and also protrudes at the other end from the tip of the semiconductor chip 521 outwardly (toward the right side of the figure). In this manner, each insulating sheet 25 wider than an overlapping region of two semiconductor chips 5 vertically adjacent thereto is disposed between the semiconductor chips 5.

As described above, the stacked mounting structure 6$b$ with semiconductor chips according to the present second embodiment can have one stacked mounting semiconductor module MD (e.g., the stacked mounting semiconductor module MDa) with portions (semiconductor chips 5) of the other module MD (e.g., the stacked mounting semiconductor module MDb) disposed in their respective spaces S therein. In contrast, as for conventional stacked mounting structures, boards are disposed in locations corresponding to the spaces S, and therefore it is not possible for the module to be partially disposed in the spaces.

Therefore, the stacked mounting structure according to the present embodiment can have a lower height than conventional stacked mounting structures, although a greater number of semiconductor chips are provided therein. That is, the stacked mounting structure according to the present embodiment can include a greater number (approximately twice as many) of semiconductor chips than conventional stacked mounting structures even if they are equal in volume, and therefore it is possible to achieve increased capacity while maintaining the standardized size of a memory card or suchlike.

Also, by using semiconductor chips 5 having a capacity of 256 MB (megabytes), it becomes possible to create an SD memory card of approximately 2 GB (gigabytes) with the stacked mounting structures 6$a$ according to the first embodiment (FIG. 2). On the other hand, the stacked mounting structures 6$b$ according to the second embodiment can achieve the capacity of approximately 4 GB, i.e., twice the capacity that can be achieved with the stacked mounting structures 6$a$. By using flexible boards as the boards 7$a$ and 7$b$, it becomes possible to obtain a flexible structure capable of flexibly holding the stacked mounting semiconductor modules MD.

Figure 17:
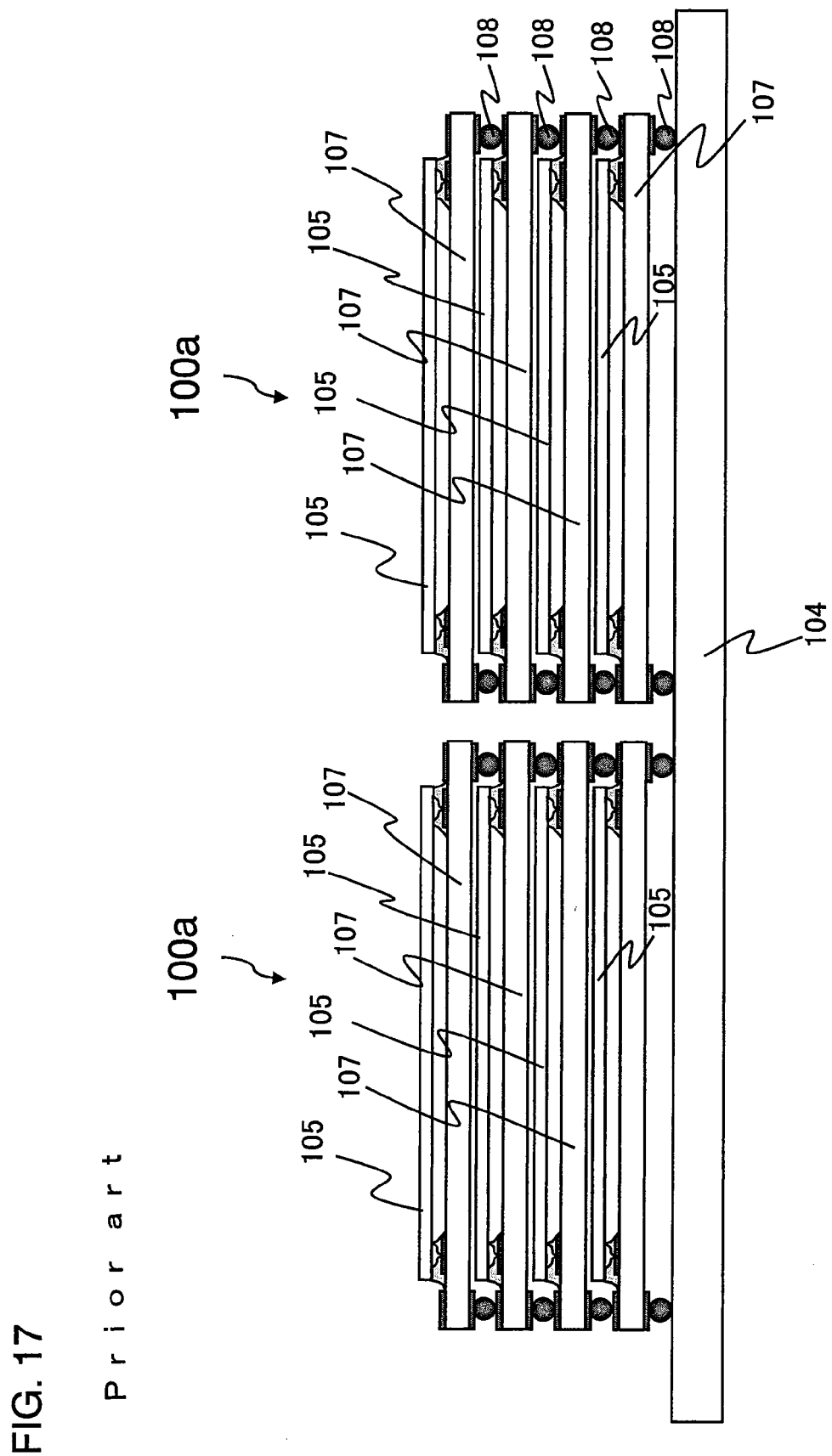
FIG. 17 is a schematic view illustrating end surfaces of conventional stacked mounting structures.
Figure 18:
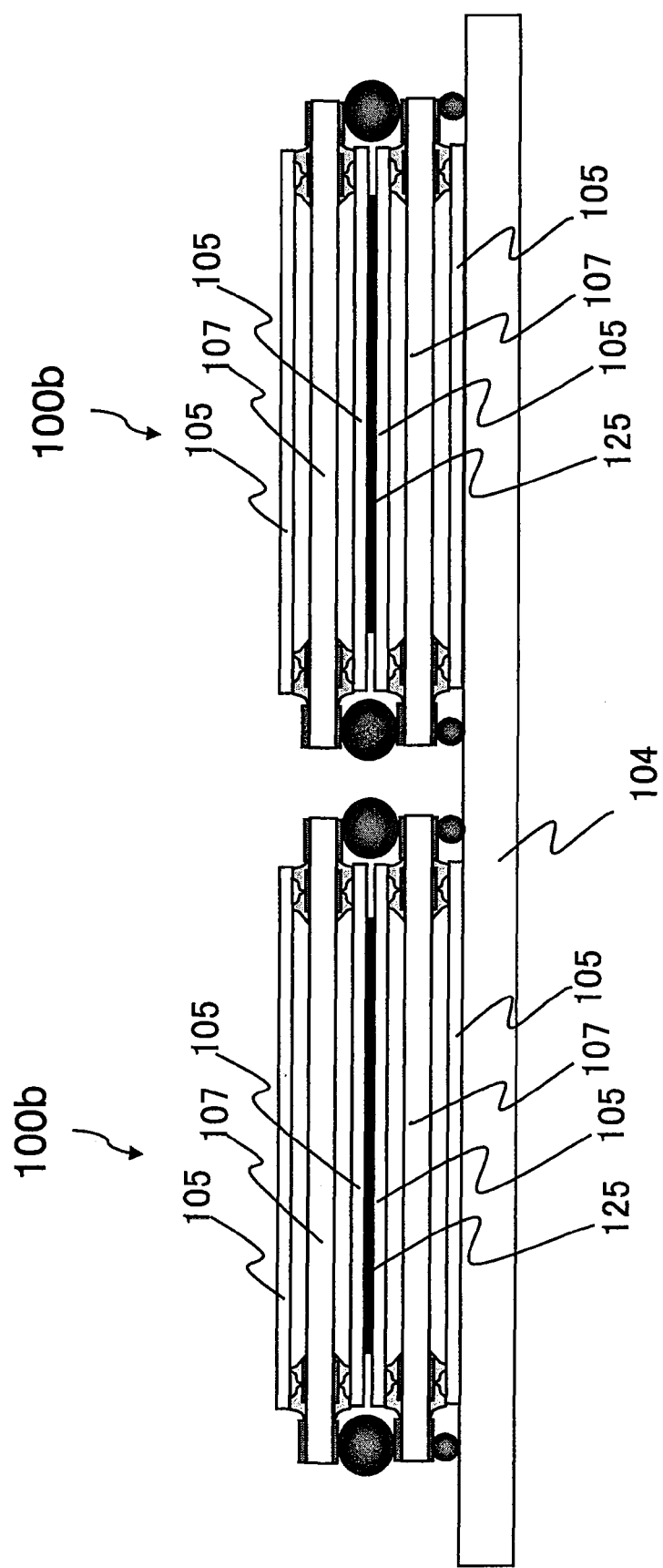
FIG. 18 is a schematic view illustrating end surfaces of stacked mounting structures as proposed in Japanese Laid-Open Patent Publication No. 2002-207986.

FIGS. 9A and 9B respectively illustrate the stacked mounting structure 6$a$ of the first embodiment and the stacked mounting structure of Japanese Laid-Open Patent Publication No. 2002-207986 (FIG. 17) for comparison in height therebetween. FIG. 9A, as with FIG. 3A, shows an end surface of the stacked mounting structure 6$a$ along with the height of each portion. Similarly, FIG. 9B shows an end surface of a stacked mounting structure 100$a'$ obtained by increasing the number of semiconductor chips 105 of the stacked mounting structure 100$a$ of FIG. 17 to eight, along with the height of each portion.

Note that as for the stacked mounting structure 6$a$ and the stacked mounting structure 100$a'$, the boards 7$a$ and are 0.09 mm and 0.1 mm thick, respectively; the semiconductor chips 5 and 105 are 0.05 mm thick; the height from the top surface of each board 7$a$, 107, to the bottom surface of the semiconductor chip 5, 105, mounted thereon is 0.03 mm; the height from the top surface of each semiconductor chip 5, 105, to the bottom surface of the board 7$a$, 107, disposed immediately above the semiconductor chip 5, 105, is 0.01 mm; the bump land 11, 111 (not shown), is 0.01 mm high; the insulating sheet 25 is 0.01 mm thick; and the solder ball 8, 108, is 0.08 mm high.

As shown in FIG. 9A, the stacked mounting structure 6$a$ is 1.04 mm high. Accordingly, the stacked mounting structure 6$b$ becomes approximately 1.10 mm high, which is greater by only approximately 0.06 mm, a combined thickness of the semiconductor chip 5 and the insulating sheet 25 (0.05 mm+0.01 mm). On the other hand, as shown in FIG. 9B, the conventional stacked mounting structure 100$a'$ is 1.68 mm high. Note that the SD memory card 1 shown in FIG. 1 has an internal thickness of approximately 1.2 mm, and therefore the stacked mounting structures 6$a$ and 6$b$ according to the first and second embodiments can be contained therein.

In this manner, when the same number of semiconductor chips are stacked, the stacked mounting structure with semiconductor chips of the present embodiment can have a reduced height as compared to conventional stacked mounting structures. In addition, since chips can be placed in spaces conventionally occupied by the board, it is possible to increase the number of semiconductor chips 5 that can be stacked, thereby increasing the capacity of the SD memory card 1.

Note that in a method for fabricating a stacked structure with semiconductor chips of the present embodiment, the semiconductor chips 5 are mounted on the flexible boards 7$a$ and 7$b$ to create the stacked mounting semiconductor modules MDa and MDb each being formed by a plurality of submodules (MDa1 to MDa4, MDb1 to MDb4). The boards 7$a$ and 7$b$ are then folded before they are mounted on the motherboard 4 using a jig placed on the motherboard 4, such that the semiconductor chips 5 are kept level. Subsequently, the stacked structures are completed with the solder balls 8 on the motherboard 4 as shown in FIGS. 2, 3A, 3B, 4A, 4B, and 8. As such, the step of laminating the flexible boards 7a and 7b and the semiconductor chips 5 constitutes an exemplary laminating step of the present invention.

Note that while all the stacked semiconductor chips 5 are mounted at one end on either surface of the flexible board 7a, 7b, in the first and second embodiments, the semiconductor chips 5 may be only mounted on one surface of the flexible board 7a, 7b. In addition, the number of stacked semiconductor chips of the stacked mounting structures 6a and 6b can be changed arbitrarily. Furthermore, the direction in which to allow the stacked mounting structure 6a to overlap with the stacked mounting structure 6b can be changed arbitrarily.

Third Embodiment

A stacked mounting structure with semiconductor chips according to a third embodiment of the present invention will be described with reference to FIGS. 10, 11, 12, 13A, 13B, and 14. The stacked mounting structure 6c according to the present embodiment is configured basically in the same manner as the stacked mounting structures 6a and 6b according to the first and second embodiments. The stacked mounting structures 6a and 6b have a plurality of semiconductor chips 5 stacked uprightly such that the outlines of the chips are in alignment with one other.

On the other hand, the stacked mounting structure 6c has a plurality of semiconductor chips 5 stacked in a staircase pattern such that the outlines of adjacent semiconductor chips 5 deviate from each other in one direction. Unless otherwise required, the following description mainly focuses on features specific to the stacked mounting structure 6c, and the description of any features in common with the stacked mounting structures 6a and 6b will be omitted.

Figure 10:
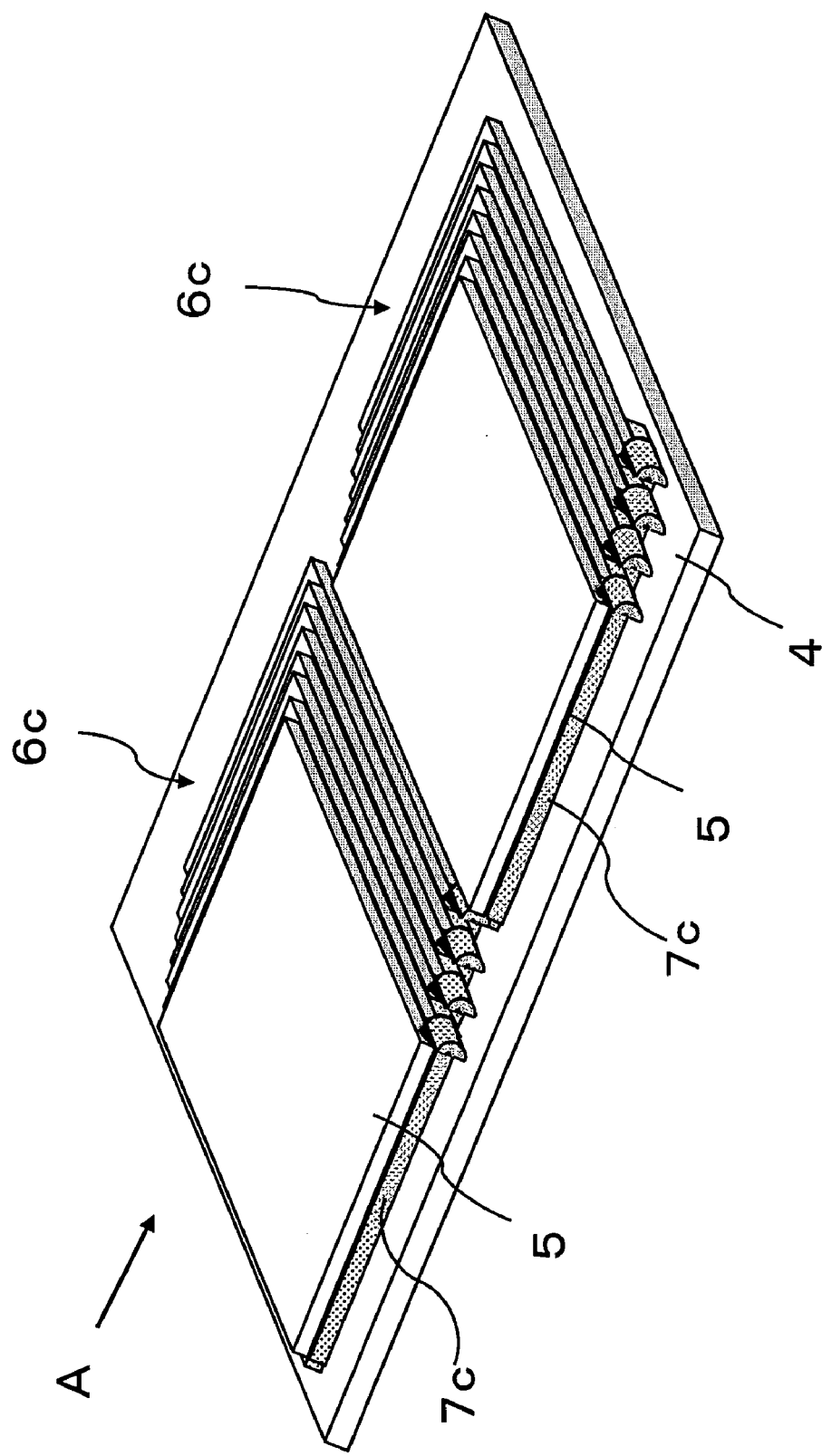
FIG. 10 is an oblique external view illustrating stacked mounting structures according to a third embodiment of the present invention.

FIG. 10 is an oblique external view illustrating the stacked mounting structures 6c according to the present embodiment. FIG. 11 illustrates an end surface of the stacked mounting structure 6c as viewed from the direction of arrow A in FIG. 10. FIG. 12 illustrates in enlargement a portion of a stacked mounting semiconductor module MDc that is enclosed by broken lines R2 in FIG. 11. Furthermore, FIG. 13A illustrates the stacked mounting semiconductor module MDc in unfolded configuration, which is shown in FIG. 11 as being folded. FIG. 13B illustrates a top view of the stacked mounting semiconductor module MDc shown in FIG. 13A.

Unlike the stacked mounting semiconductor modules of the stacked mounting structures 6a and 6b, the stacked mounting semiconductor module MDc of the stacked mounting structure 6c is folded so as to form a staircase pattern at one end, as shown in FIGS. 10 and 11. Moreover, the semiconductor chips 5 are mounted alternately on the front and back surfaces of a board 7c, as shown FIG. 13A.

The semiconductor chips 51 to 58 are disposed above their respective step portions $7c_1$ to $7c_8$ of the folded board 7c in the stacked mounting structure 6c, as shown in FIG. 11, while being mounted alternately on both surfaces of the board 7c in the stacked mounting semiconductor module MDc, as shown in FIG. 13A.

Note that the insulating sheet 25 is disposed between each respective semiconductor chip 5, but omitted in FIG. 11 for the sake of overall visibility.

FIG. 12 illustrates in enlargement a portion of the stacked mounting semiconductor module MDc8 that is enclosed by broken lines R2 in FIG. 11. Note that the semiconductor chip $5_7$ is not shown for the sake of overall visibility. The semiconductor chip $5_8$ is mounted on the eighth-from-bottom step $7c_8$ of the folded board 7c (hereinafter, abbreviated as the "board $7c_8$") by flip-chip bonding. The board $7c_8$ is provided with connecting portions $50c_8$ for connecting with the semiconductor chip $5_8$. Concretely, electrodes 10 are provided on the surface of the board $7c_8$ that faces the semiconductor chip $5_8$, each electrode 10 having a bump land 11 provided thereon. Electrode bumps 14 are provided on the surface of the semiconductor chip $5_8$ that faces the board $7c_8$, each electrode bump 14 having a bump 9 provided thereon. In addition, a reinforcing resin 13 is provided around the bumps 9, the bump lands 11, and the electrode bumps 14, with the bumps 9 connected to the bump lands 11.

Returning next to FIG. 11, advantages of the stacked mounting semiconductor module MDc will be described in further detail taking the submodules $MDc_1$ and $MDC_2$ as examples. Note that in the following description, each portion of the folded board 7c will be referred to in an abbreviated manner, such as the bottom portion $7c_1$ of the board 7c and the second-from-bottom portion $7c_2$ will be abbreviated as the boards $7c_1$ and $7c_2$, respectively.

Of the two submodules $MDc_1$ and $MDc_2$, the lower submodule $MDc_1$ includes the semiconductor chip $5_1$, which is disposed such that a tip 5a connected to the board $7c_1$ faces an inner end surface 70 of the board $7c_2$, and is accommodated in space Sc defined by a plane including the bottom surface 5b of the semiconductor chip $5_2$ and a plane including the top surface of the board $7c_1$. That is, when imagining a rectangular space encompassing the upper submodule $MDc_2$, the lower submodule $MDc_1$ is disposed so as to partially overlap with an unoccupied portion (space Sc) of the space. Similarly, the submodule $MDc_2$ is disposed so as to partially overlap with an unoccupied portion of an imaginary rectangular space encompassing the submodule $MDc_3$. In this manner, in the case of the stacked mounting structure 6c, for all submodules $MDc_2$ to $MDc_8$, excluding the bottom submodule $MDc_1$, unoccupied portions of imaginary rectangular spaces encompassing their respective submodules MDc have the submodules immediately therebelow partially overlapping therewith.

As described above, in the case of the stacked mounting structure 6c with semiconductor chips of the third embodiment, an unoccupied portion (space Sc) of each submodule MDc can have a part of another submodule MDc disposed therein. On the other hand, in the case of conventional stacked mounting structures, the boards 105 are disposed in locations corresponding to the spaces Sc, and therefore it is not possible to dispose the submodules MDc so as to partially overlap with one another. Thus, the stacked mounting structure 6c according to the present embodiment can have an increased number of stacked semiconductor chips due to reduced height, as compared to conventional stacked mounting structures, thereby achieving increased capacity.

FIGS. 14A and 14B, as with FIGS. 9A and 9B, respectively illustrate the stacked mounting structure 6c and the stacked mounting structure 100a' for comparison in height therebetween. Note that the stacked mounting structure 100a' is as described with reference to FIG. 9B. In the case of the stacked mounting structure 6c, when the boards $7c_1$ to $7c_8$ are 0.09 mm thick; the semiconductor chip 5 is 0.05 mm thick; the height from the top surface of each board, $7c_1$ to $7c_8$, to the semiconductor chip 5 mounted thereon, is 0.04 mm; the height from the top surface of the semiconductor chip 5 to the bottom surface of the board, $7c_2$ to $7c_8$, mounted thereon is 0.01 mm; the bump land 11 is 0.01 mm high; the insulating sheet 25 is 0.01 mm thick; and the solder ball 8 is 0.08 mm thick, the stacked mounting structure 6c is 0.89 mm high. On the other hand, the stacked mounting structure 100a' is approximately 1.68 mm high.

As such, when the same number of semiconductor chips are stacked, the stacked mounting structure 6c with semiconductor chips of the present embodiment can have a reduced height as compared to the conventional stacked mounting structure 100a'. Therefore, if the volume is the same, the stacked mounting structure 6c can have approximately one and a half times the number of semiconductor chips 5 that can be stacked in the stacked mounting structure 100a', and therefore it is possible to increase the capacity of the SD memory card 1.

Furthermore, by using 0.05 mm-thick boards 7c, it becomes possible to configure a 0.88 mm-thick stacked mounting structure 6c with sixteen boards $7c_1$ to $7c_{16}$ (0.05 mm×16=0.8 mm) and solder balls 8 (0.08 mm high).

Fourth Embodiment

Figure 16:
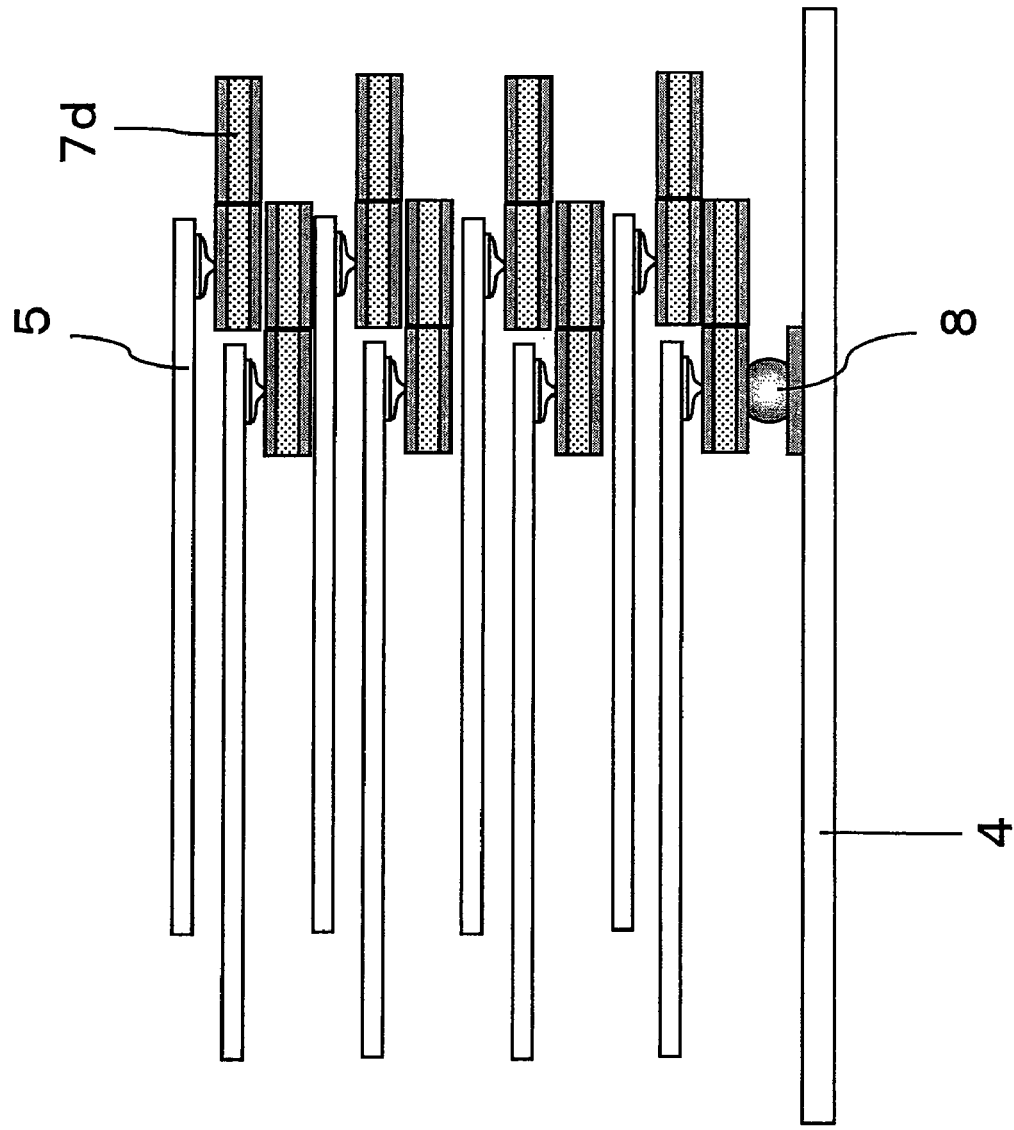
FIG. 16 is a schematic view illustrating an end surface of the stacked mounting structure as shown in FIGS. 15A and 15B.

A stacked mounting structure according to a fourth embodiment of the present invention will be described with reference to FIGS. 15A, 15B, and 16. FIG. 15A, as with FIG. 13A, illustrates a stacked mounting semiconductor module MDd in unfolded configuration, which is included in the stacked mounting structure 6d (not shown) according to the present embodiment. FIG. 15B illustrates a top view of the stacked mounting semiconductor module MDd shown in FIG. 15A. FIG. 16, as with FIG. 11, illustrates an end surface of the stacked mounting structure 6d.

In the case of the stacked mounting semiconductor module MDc according to the third embodiment, the location where the electrodes 20 for connecting the board 7c and the motherboard 4 are provided, i.e., the location of one side end portion of the semiconductor chip 5, deviates in a staircase pattern in one direction, as shown in FIG. 11. On the other hand, in the case of the stacked mounting semiconductor module MDd according to the present embodiment, the location where the electrodes 20 are provided, i.e., the location of one side end portion of the semiconductor chip 5, deviates back and forth in one direction perpendicular to the laminating direction, as shown in FIG. 16. Correspondingly, boards 7d are arranged in a staggered pattern (in two rows) along the longitudinal direction, as shown in FIGS. 15A and 15B. Such staggered arrangement enables more stable mounting of the boards 7d on the motherboard 4.

Note that the above embodiments have been described taking the SD memory card as an example of the memory card of the present invention without limitation, and the present invention is also applicable to, for example, a mini SD memory card. Also, it is understood that the present invention is applicable not only to memory devices but also to any structures with a plurality of stacked semiconductor chips.

The stacked mounting structure with semiconductor chips of the present invention achieves the effect of allowing a greater number of laminations than conventionally, and is useful for memory cards, and so on.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A stacked mounting structure comprising:
    a plurality of semiconductor chips each having electrodes provided at least at one end; and
    a holding member for holding the semiconductor chips at the one end,
    wherein the holding member is folded with at least two of the semiconductor chips being stacked so as to at least partially overlap with each other, and
    wherein the semiconductor chips are stacked so as to be flush at the one end with one another in a lamination direction, and
    wherein the location of the one end alternately deviates back and forth in one direction perpendicular to the lamination direction.

2. The stacked mounting structure according to claim 1, wherein the holding member is composed of a tape-like sheet.

3. The stacked mounting structure according to claim 1, wherein the holding member has an electronic part mounted thereon.

4. The stacked mounting structure according to claim 1, wherein the holding member and the semiconductor chips are joined via bumps.

5. The stacked mounting structure according to claim 1, further comprising an insulating sheet interposed between each respective semiconductor chip.

6. A stacked mounting structure comprising first and second units, wherein at least one of the first and second units is composed of a stacked mounting structure of claim 1, and
    the first and second units are assembled with their respective semiconductor chips overlapping with one another.

7. A memory card comprising:
    a motherboard having provided thereon a stacked mounting structure of claim 1; and
    an IC chip for controlling semiconductor chips of the stacked mounting structure.

8. The stacked mounting structure according to claim 1, wherein the semiconductor chips at least partially protruding from the holding member.

* * * * *